United States Patent [19]

Tanaka

[11] 4,398,833
[45] Aug. 16, 1983

[54] ELECTRONIC TIMEPIECE

[75] Inventor: Kojiro Tanaka, Tokyo, Japan

[73] Assignee: Kabushiki Kaisha Daini Seikosha, Tokyo, Japan

[21] Appl. No.: 176,502

[22] Filed: Aug. 8, 1980

Related U.S. Application Data

[63] Continuation-in-part of Ser. No. 876,202, Feb. 9, 1978, abandoned.

[30] Foreign Application Priority Data

Feb. 22, 1977 [JP] Japan .................................. 52-18415

[51] Int. Cl.³ .............................................. G04F 5/07
[52] U.S. Cl. .................................... 368/156; 307/477
[58] Field of Search ..................................... 368/85–87, 368/155–160, 184, 200–202, 217–219; 307/446, 447, 448, 220 R, 220 C, 224 R, 224 C, 225 R, 225 C, 477; 357/22, 92

[56] References Cited

U.S. PATENT DOCUMENTS 3,986,199 10/1976 Williams ................................ 357/46
4,119,867 10/1978 Morokawa et al. ................. 368/219
4,259,681 3/1981 Nishizawa .......................... 307/447

OTHER PUBLICATIONS

"Junction FET Designed for Speed & Logic", Electronics, 8/19/76.
"FET Versus Analog Transistor (SIT)", IEEE Transactions on Electron Devices, 4/75, p. 185ff.

*Primary Examiner*—Vit W. Miska
*Attorney, Agent, or Firm*—Robert E. Burns; Emmanuel J. Lobato; Bruce L. Adams

[57] ABSTRACT

An electronic timepiece including a time-base signal source having a quartz vibrator operating at a frequency of 1 MHz or higher, and a multi-stage divider. At least one stage of the divider is comprised of a static induction transistor logic inverter (SITL inverter), which includes a static induction transistor (SIT) and a bipolar load transistor, operating at a bias voltage of or less than 0.5 volts. The time-base signal source may comprise an oscillator circuit which also includes a static induction transistor.

18 Claims, 36 Drawing Figures

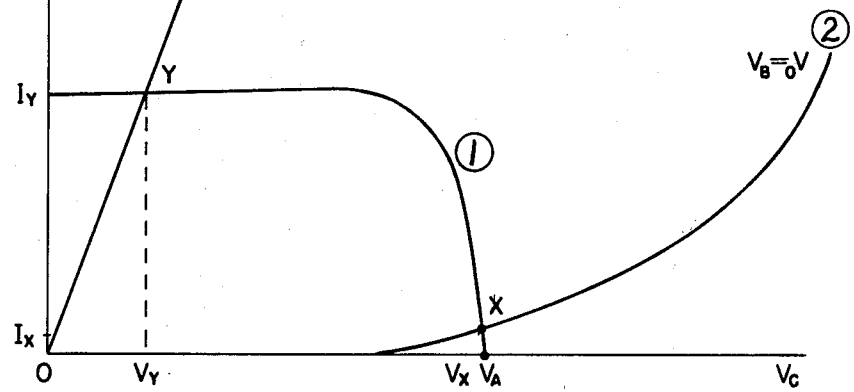

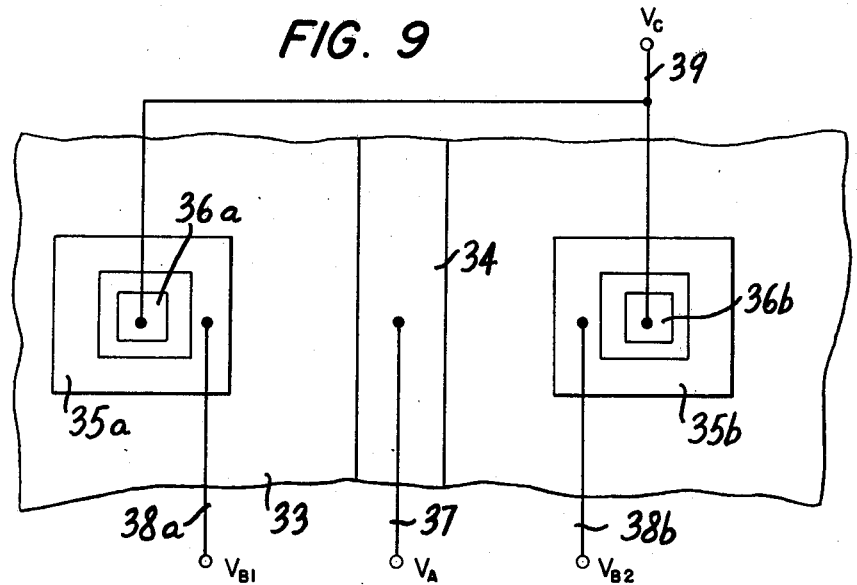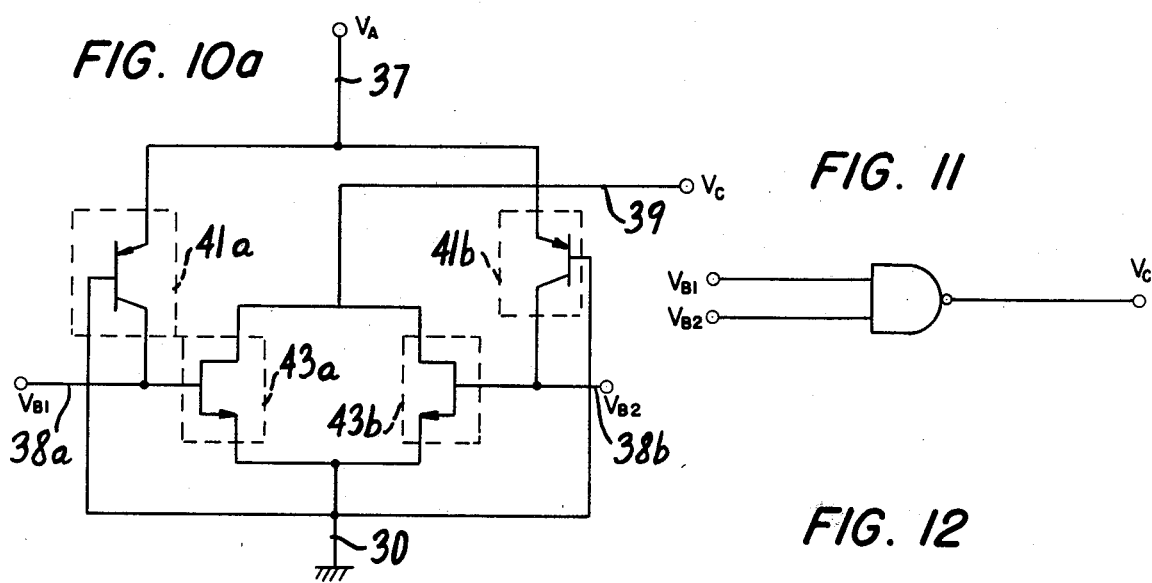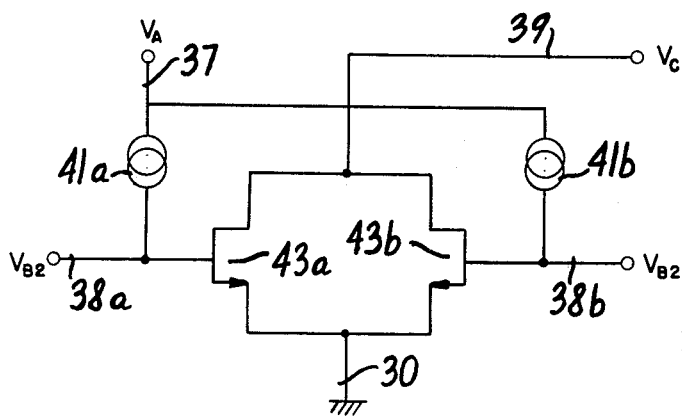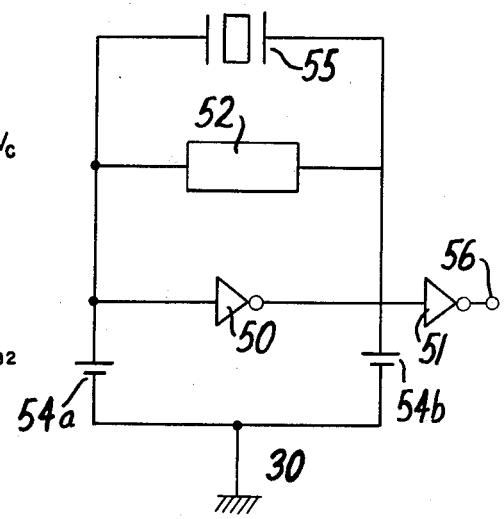

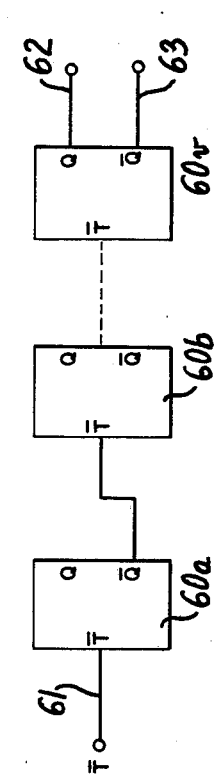
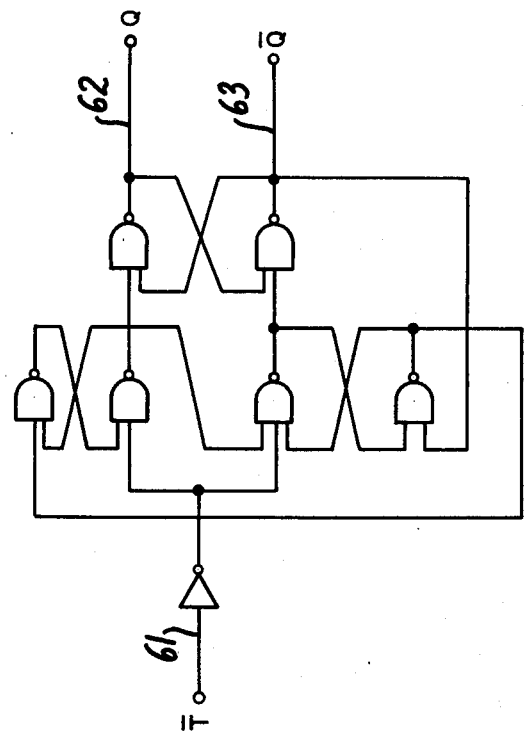
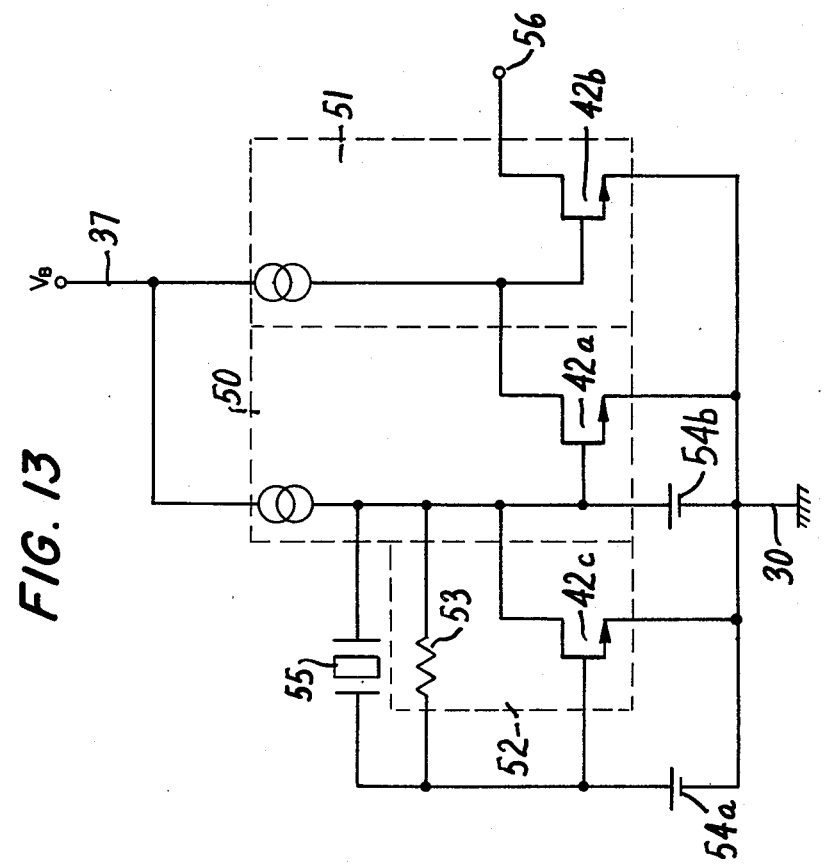
FIG. 14
FIG. 15
FIG. 13

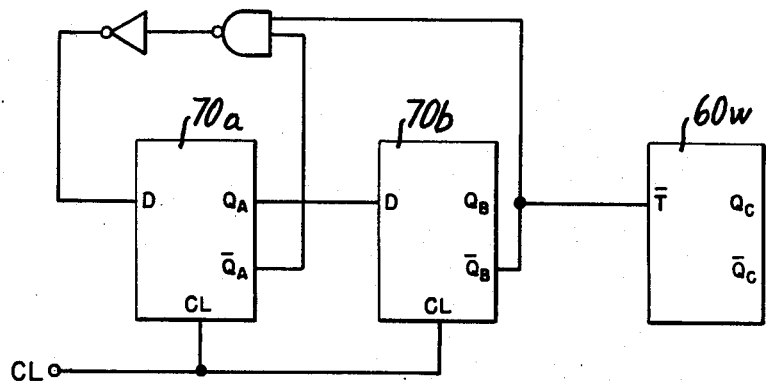
FIG. 17
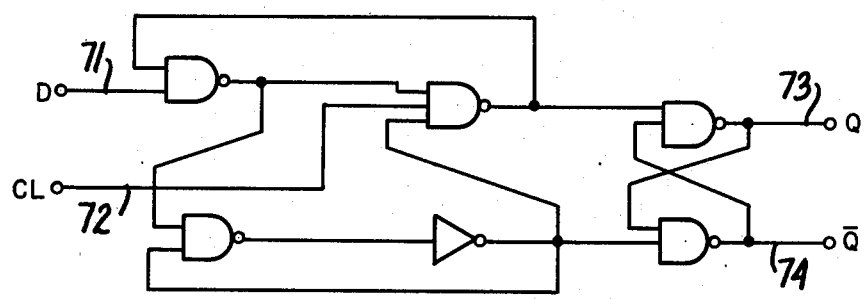
FIG. 18
FIG. 19
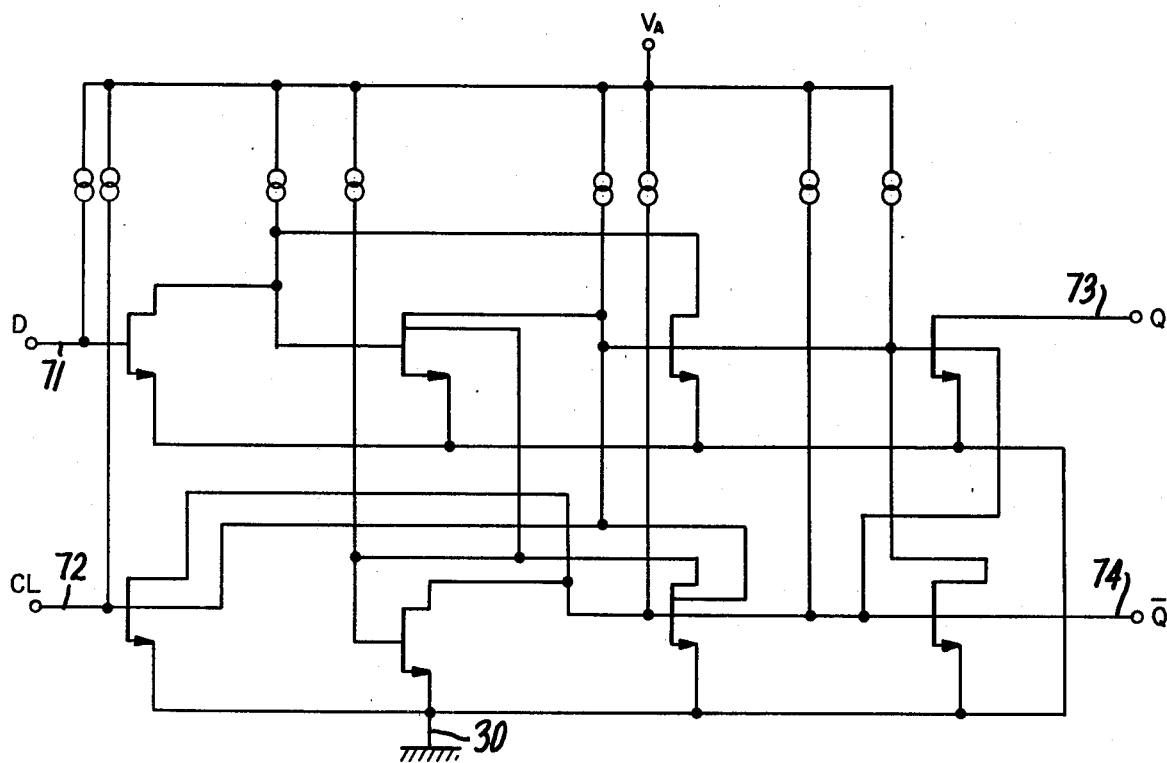

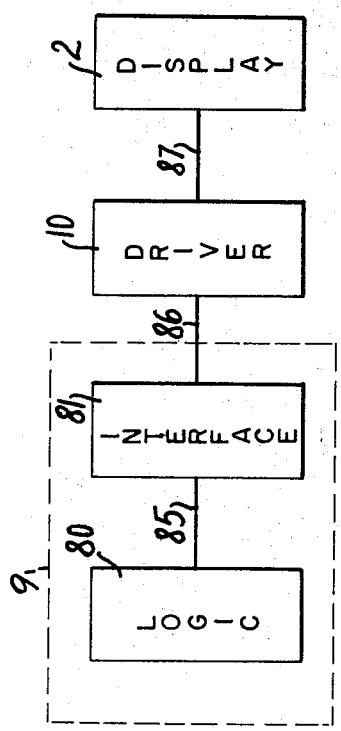
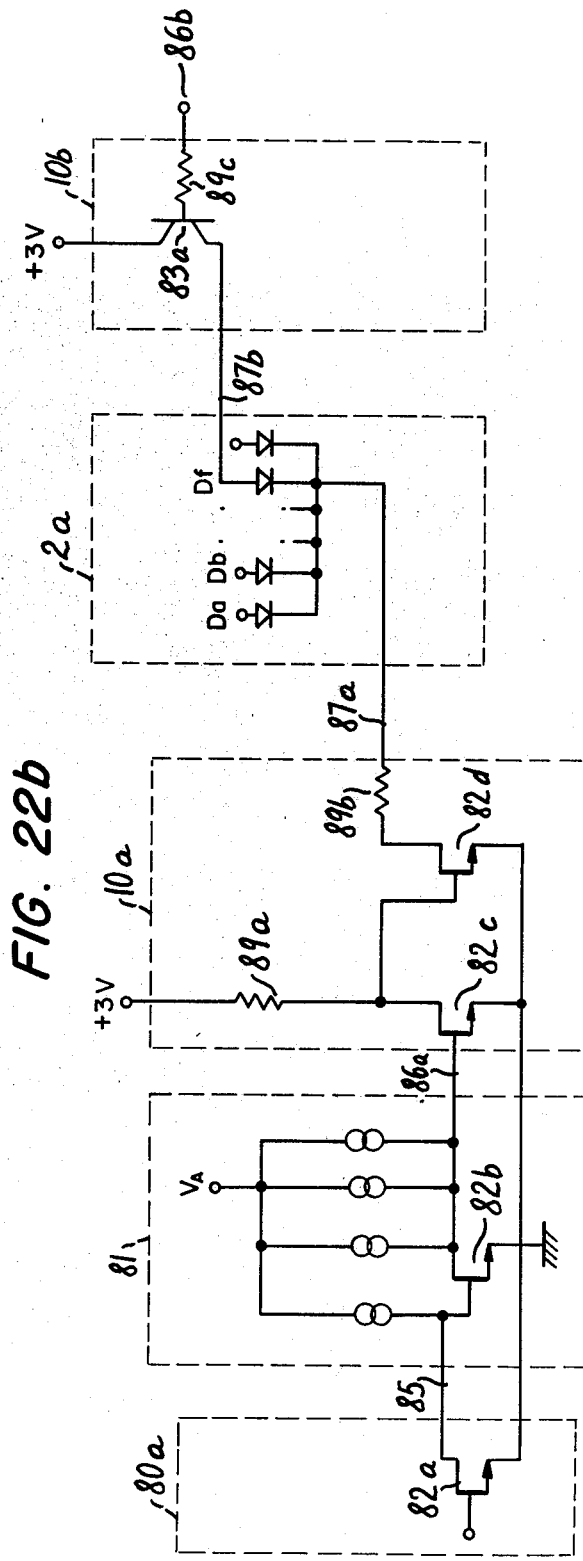
FIG. 22a
FIG. 22b

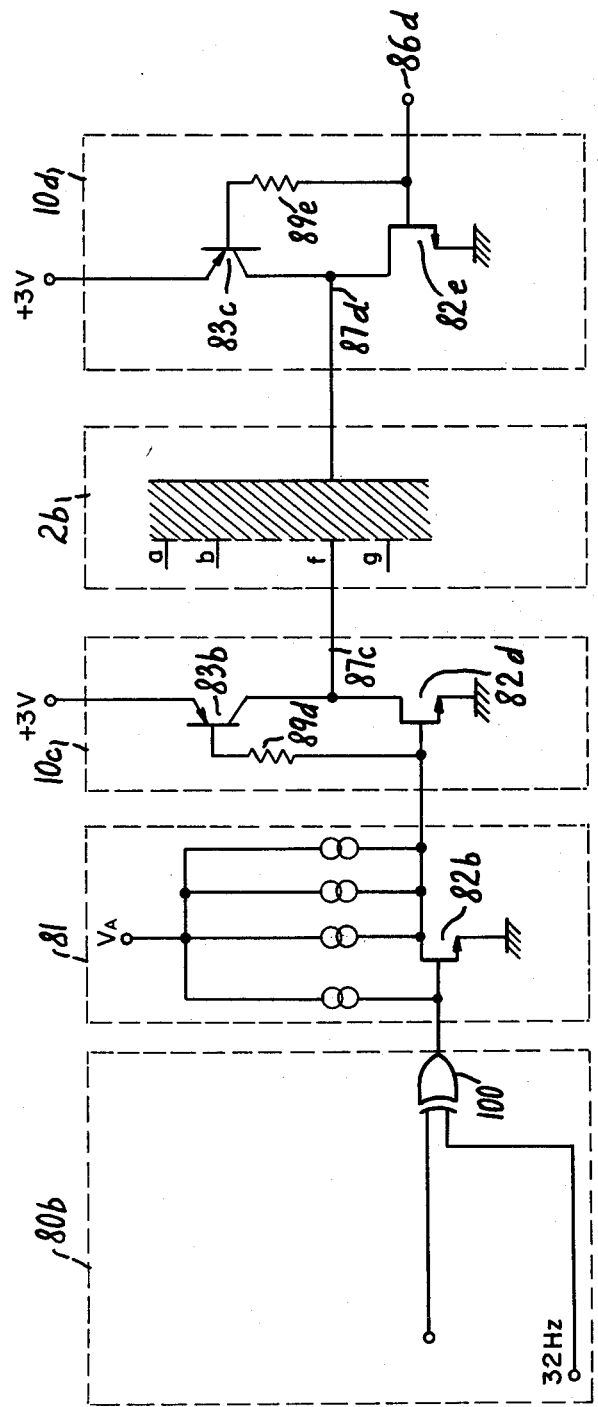
FIG. 23
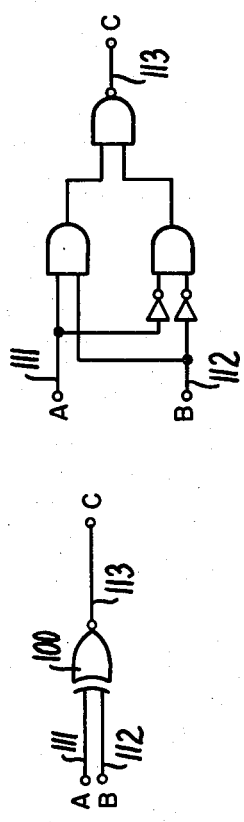
FIG. 24b
FIG. 24a

ELECTRONIC TIMEPIECE

RELATED APPLICATION

This is a continuation-in-part of prior copending application Ser. No. 876,202 filed Feb. 9, 1978 and now abandoned.

BACKGROUND OF THE INVENTION

The present invention relates to an electronic timepiece which operates with high accuracy and low power consumption, such as an electronic wrist watch and an electronic clock.

The accuracy of an electronic timepiece depends on an oscillating circuit used as a source for a time-base signal. Particularly, when a quartz crystal oscillating circuit is used as a time-base signal source for an electronic watch, the accuracy of the electronic watch mainly depends on a quartz vibrator of the oscillating circuit. On the other hand, the power consumption of the electronic watch depends mainly on the power consumption of a display device for displaying the time, and the power consumption of an electric circuit consisting of a time-operating circuit including the time-base signal source for the watch and a display-driving circuit for driving the display device. Recently, this electric circuit has been realized by using a semiconductor integrated circuit (hereinafter, referred to as an IC).

The power dissipated in an IC is broadly classified either as a static power which does not depend on the operating frequency in the circuitry of the IC, or a dynamic power which is proportional to the operating frequency.

On the other hand, the accuracy of the quartz vibrator mainly depends on the rate of frequency vs. temperature change for the natural frequency thereof.

The tuning fork-type vibrator having a natural vibration frequency of 32 kHz is presently widely used as the quartz vibrator for an electronic watch. However, the frequency vs. temperature characteristic of the 32 kHz vibrator is not good. Therefore, when this kind of vibrator is used to obtain the time-base signal for a watch, the watch has an error of about 10 seconds per month. On the other hand, when an AT cut quartz vibrator of 4 MHz natural frequency is used to obtain the time-base signal for a watch, the accuracy is about 10 seconds per year. Therefore, it is clear that the accuracy of the watch will increase substantially when the vibrator of 4 MHz is used in the watch.

In the past, great efforts have been made to improve the accuracy of the electronic watch. One way of improvement is to use the AT cut quartz vibrator of 4 MHz for obtaining the time-base signal. As described above, when the watch time-base signal having a higher frequency is used, the dynamic power which is a part of the total power consumption in the watch IC will be increased. Consequently, if the vibrator frequency is merely changed from 32 kHz to 4 MHz, without any change to the IC, the dynamic power of the IC will be increased by at least a hundred times.

Actually, in the case of the hand-display type quartz wrist watch which has received practical application, the total power consumption of the watch in which the vibrator of 32 kHz is used will be about 2 μW, and the total power consumption of the watch in which the vibrator of 4 MHz is used will be more than 10 μW. Thus, it will be understood that the watch using the 32 kHz vibrator can be operated continuously for more than five years without change of battery, while the watch using the 4 MHz vibrator can be operated continuously for only one year or less.

SUMMARY OF THE INVENTION

It is an object of the present invention to provide an electronic timepiece which can be operated with higher accuracy than that of the conventional watch, and with lower power consumption than that of the conventional watch.

The object of the invention is achieved by providing an electronic watch in which, by using low dynamic power IC circuitry in the watch IC, the total power consumption thereof is less than that of the conventional watch in spite of use of a high accuracy time-base signal for the watch produced by a 4 MHz quartz vibrator.

BRIEF DESCRIPTION OF THE DRAWINGS

FIG. 9 shows a plane view of the NAND gate shown in FIG. 8;

FIGS. 10a and 10b show equivalent circuit diagrams of the NAND gate shown in FIG. 8;

FIG. 11 shows a circuit diagram symbol for the NAND gate shown in FIG. 8;

FIG. 12 shows an example of a crystal oscillating circuit for a watch using SITL;

FIG. 13 is a detailed circuit diagram of the oscillating circuit shown in FIG. 12;

FIG. 14 shows a frequency dividing circuit which is comprised of T-type flip-flops;

FIG. 15 is a logic diagram of the T-type flip-flop;

FIG. 17 is a six advance counting circuit which is widely used as a counting circuit for a watch;

FIG. 18 is a logic diagram of the D-type flip-flop shown in FIG. 17;

FIG. 19 shows an equivalent circuit of the D-type flip-flop shown in FIG. 17 realized by using SITL;

FIG. 22(a) is a block diagram showing the connection between a decoder IC and the display device of the watch;

FIG. 22(b) is an equivalent circuit of the circuit shown in FIG. 22(a) realized by using SITL;

FIG. 23 is a block diagram illustrating the driving relationship between different circuit stages for the case of a liquid crystal display device;

FIG. 24(a) shows a circuit diagram symbol for an exclusive-OR gate;

FIG. 24(b) is a logic diagram of the exclusive-OR gate shown in FIG. 24(a);

DESCRIPTION OF THE PREFERRED EMBODIMENT

Hereinafter, the present invention will be explained with reference to the illustrated preferred embodiment.

Figure 1:
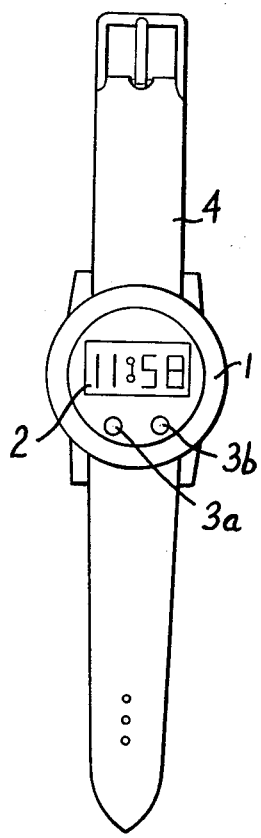
FIG. 1 shows an external view of an embodiment of a digital electronic watch according to the present invention.

FIG. 1 shows an external view of the preferred embodiment of the electronic wrist watch according to the present invention. A digital display device 2 is located at the center portion of a watch case 1 in such a way that the device 2 can be seen directly from outside the case. In addition, two push-button switches 3a and 3b for setting the time are arranged thereon, and a watch band 4 is attached to the case 1 in order to be able to wear it. In the case 1 a battery, a quartz vibrator, and an IC or the like, other than the display device 2 are incorporated, and they are connected to each other in such a way that electrical operation can be correctly performed.

Figure 2:
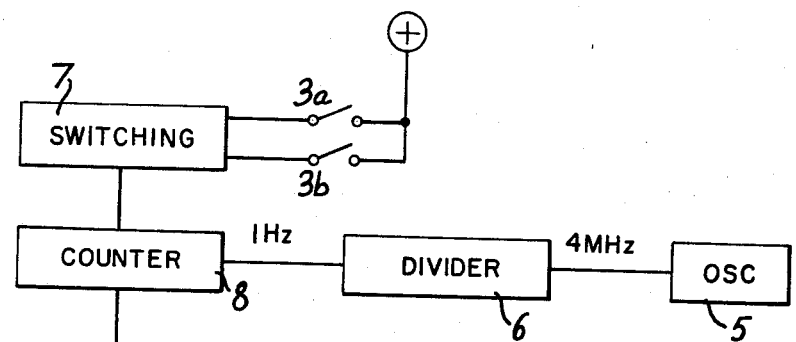
FIG. 2 is a block diagram of the circuit of the digital-type wrist watch shown in FIG. 1.

FIG. 2 is a block diagram of the circuit of the digital-type wrist watch shown in FIG. 1. In this block diagram, a crystal oscillating circuit 5, which uses a quartz vibrator of 4 MHz, is used as a time-base signal source for the watch, and the output signal of the circuit 5 is divided down to a one second signal by using a frequency dividing circuit 6 comprising twenty-two stages of T-type flip-flops. The one second signal pulses from the frequency dividing circuit 6 are counted by a counting circuit 8 which develops a count representative of the time in the form of a binary signal. The time signal represented by the binary signal from the counting circuit 8 is decoded, and the decoded signal is applied to a driving circuit 10 for driving the display device 2. In addition, the circuit shown in FIG. 2 comprises a signal converting circuit or decoder 9, and a light emitting diode, liquid crystal, or electrochromic display.

Figure 3:
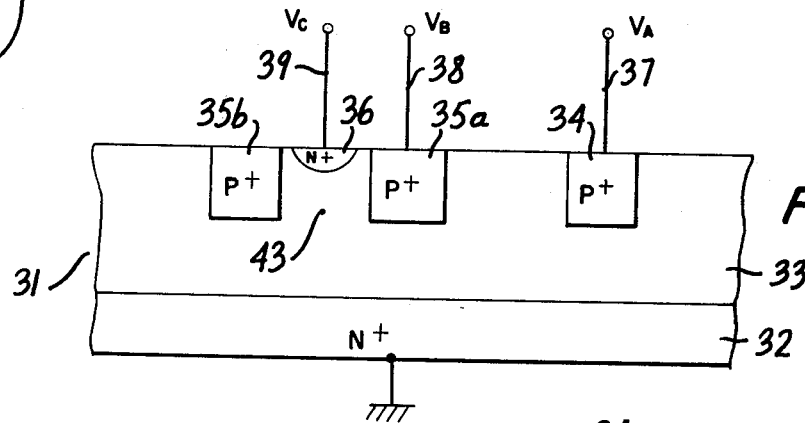
FIG. 3 shows a basic SITL inverter which is used as the IC of the electronic watch according to the present invention.
Figure 4:
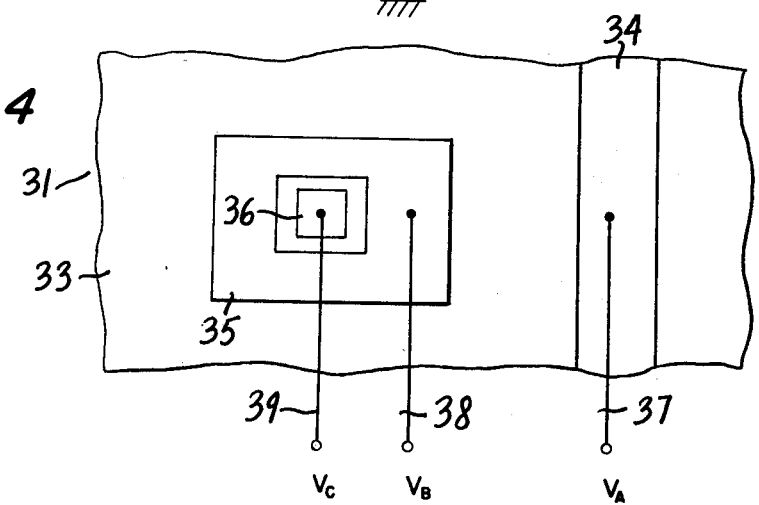
FIG. 4 shows a plane view of the IC structure of the SITL shown in FIG. 3.
Figure 5A:
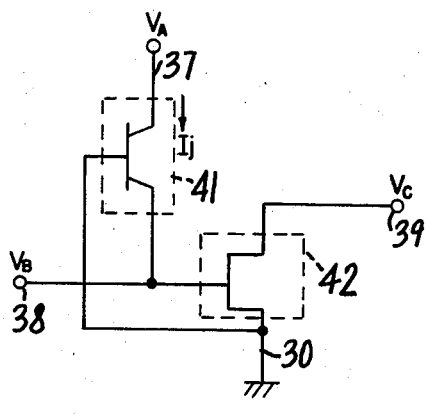
FIGS. 5a and 5b show electrical equivalent circuits for the SITL.
Figure 5B:
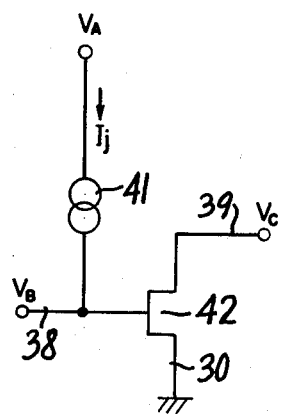
Figure 6:
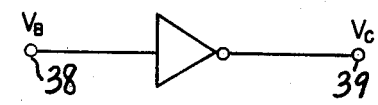
FIG. 6 shows a circuit diagram symbol for the equivalent circuit shown in FIGS. 5a and 5b.

FIG. 3 shows a basic SITL inverter which is used in the IC of the timepiece according to the present invention. The SITL has been invented by Nishizawa, Tohoku University and its operating principles and basic structure have been described in the "NIKKEI ELECTRONICS" (Sept. 26, 1976, pages 40–45). The SITL has the advantage that its dynamic power is very low in principle. The present invention is realized by using SITL in the IC for an electronic timepiece such as a watch or a clock, which has high accuracy because it includes a 4 MHz quartz vibrator (typically AT-cut quartz vibrator), for example. In this invention, the time base signal source can be effectively used at a high frequency than about 1 MHz, for example, 2 MHz (typically GT-cut quartz vibrator) as well as 4 MHz. For the 4 MHz watch IC, the SITL is superior to IIL or CMOS with respect to the dynamic power dissipation and the operating voltage, because the watch IC is operated by the electrical supply from a small battery with a limited voltage and current capacity. This is described hereafter by the description of the disclosed invention and drawings.

Now, the basic SITL inverter of the SITL will be explained in conjunction with FIGS. 3 through 6, wherein the same reference numerals indicate the same or equivalent circuit portions.

The basic inverter of the SITL is composed of two transistors. One is a static induction transistor (SIT) 42, and the other is a bipolar transistor 41 used as a current source for the current $I_j$ (see FIGS. 5a and 5b). The substrate 32 (or buried layer) of the IC is an N-type Si semiconductor having a high impurity concentration, e.g., on the order of $10^{19}$cm$^{-3}$, and an N-type Si layer 33 having a low impurity concentration, e.g., on the order of $10^{13} \sim 10^{14}$cm$^{-3}$ or less, is grown on the substrate 32 by the method of epitaxial growth. Next, a region corresponding to an emitter 34 of the transistor 41 and a region corresponding to a collector of the transistor 41 and to a gate 35 of the SIT 42 are formed by a P-type semiconductor layer having a high impurity concentration, e.g., on the order of about $10^{19}$cm$^{-3}$. In addition, a region corresponding to a drain 36 of the SIT 42 is formed of N-type semiconductor with a high impurity concentration, e.g., on the order of about $10^{19}$cm$^{-3}$. Finally, metal electrodes, such as aluminum or the like, are formed in order to make desired electrical connections, and then the protection for the surface is made of a phosphorus-glass covering. Therefore, the fabrication of the IC needs only five masking operations.

The behavior of the inverter of the SITL will be now explained, hereinafter. When an input terminal 38 of the inverter is grounded, that is, when the logic value of the input terminal is "0", a depletion layer will spread between the gate 35 of the SIT 42 and a channel 43 because of the junction voltage. For example, when the channel is an N-type semiconductor with an impurity concentration on the order of about $10^{13}$cm$^{-3}$, the thickness of the depletion layer is about 10 μm. Therefore, the width of the channel 43, i.e., the gate spacing (the width between gate portions 35a and 35b of the SIT 42 shown in FIG. 3), should be designed in such a way that the channel 43 of the SIT 42 is completely depleted when the electrode 38 of the gate 35a is grounded. When the impurity concentration of the channel region 43 is $10^{13}$ or $10^{14}$cm$^{-3}$, the gate spacing should be less than about 20 μm or 7.5 μm, respectively.

The depleted channel 43 makes it difficult for a drain current to flow to the source 32 even if the voltage at the drain electrode 39 and the drain 36 is high. In order to decrease the off-state drain current, the gate spacing is narrower because the potention barrier against the injected carrier from the source 32 is higher. The SIT 42 is turned off, and the output terminal 39 of the inverter will be in the open condition. That is, the logic output level becomes "1". At this time, the current $I_j$ flowing into the gate 35 of the SIT 42 via the transistor 41 flows through the lead 38 of the gate to the substrate (which is also used as the source 32 of the SIT 42).

On the other hand, when the input terminal 38 of the inverter becomes open, the current $I_j$ flows into the gate 35 of the SIT 42 from the transistor 41, the potential $V_B$ of the gate 35 rises, and finally, the value of the potential $V_B$ becomes nearly equal to the value of an applied voltage $V_A$.

$$V_B \doteq V_A \quad (1)$$

As a result, since the junction between the gate 35 and the channel 43 of the SIT 42 is biased in the forward direction, the thickness of the depletion layer or the height of the potential barrier is decreased, and the channel 45 allows charge carriers to flow therethrough. When the current is injected from the output terminal 39 to the drain 36 of the SIT, the current will flow from the drain 36 of the SIT to the source 33. That is, the value of the logic output level becomes "0". From the description above it will be understood that the logic value of the output 39 becomes "1" when the logic value of the input 38 of the inverter is "0", and the output 39 becomes "0" when the input 38 is "1". Therefore, the inverter constructed by using the SITL can be used as a logic element which is represented by the logic symbol shown in FIG. 6.

As described before, it is important that an IC which can be operated at a higher frequency with lower dynamic power be used for the design of an electronic watch. The dynamic power of the IC depends mainly on the value of a stray capacitance determined by its structure. This dynamic power $P_f$ is given by the equation $$P_f \doteq C \times V_a \times f \quad (2)$$

where C is the value of the stray capacitance for one stage of the inverter, Va is an applied voltage, and f is an operating frequency.

In order to show that there is a difference in the value of the dynamic power $P_f$ among the different kinds of ICs, the stray capacitance C in a CMOS-IC, a IIL-IC and a SITL-IC are each calculated, below.

(i) The stray capacitance C in the CMOS-IC is mainly composed of a gate capacitance which is inevitable, and it is impossible to remove the gate capacitance from the CMOS-IC.

Assuming that the size of the gate is 7.5 μm×7.5 μm and the gate thickness is 1000 Å, the value of the capacitance C is about 0.1 pF. And the applied voltage is usually about 1 volt.

(ii) The stray capacitance C in the IIL-IC is mainly composed of a junction capacitance between the base and the collector of a NPN transistor and a junction capacitance between the emitter and the base of that transistor. Assuming that the impurity concentration of the epitaxial layer which act as the emitter region of the NPN transistor is $10^{15}$cm$^{-3}$, the size of the base thereof is 22.5 μm×22.5 μm×3 μm, and the size of the collector thereof is 7.5 μm×1 μm, the capacitance is about 0.5 pF. The applied voltage is usually 0.7 volts or higher.

(iii) On the other hand, the SITL-IC is nearly equal in area to the IIL-IC. Assuming that the size of a gate region is 22.5 μm×22.5 μm×3 μm and the size of a drain region is 7.5 μm×7.5 μm×1 μm, the capacitance C of the SITL-IC decreases. The small capacitance of SITL can be obtained due to the low impurity concentration of $10^{13}$~$10^{14}$cm$^{-3}$ or less and the small junction areas between the source 32 and the gate 35 and between the drain 36 and the gate, as compared to those of the IIL. Furthermore, since the junction capacitance decreases with a decrease in applied voltage, the low applied voltage contributes to the small stray capacitance, i.e. the low dynamic power as described later. Therefore, the value of stray capacitance C of the SITL is 1/10, or less, of that of IIL.

In Table 1, the dynamic power/inverter of different IC structure is listed.

TABLE I

| IC | Va | Dynamic power/inverter | |
|---|---|---|---|
| | | C | Dynamic Power at 4 MHz |
| CMOS | 1 V | 0.1 pF | 0.4 μW |
| ILL | 0.7 V | 0.05 pF | ~0.1 μW |
| SITL | 0.7 V | 0.005 pF | ~0.01 μW |
| | 0.5 V | 0.005 pF | ~0.005 μW |

As seen in Table 1, the dynamic power of SITL is the lowest, although the dynamic power of both ILL and SITL are actually a little higher than those listed in Table 1 because of the storage effect of minority charge carriers.

To decrease the dynamic power dissipation, it is important to decrease the applied voltage as well as the stray capacitance. It will be described below that the SITL can be operated at lower applied voltage than IIL at 4 MHz.

Generally, the propagation delay time τ can be estimated for both SITL and IIL by the following equation:

$$\tau \doteq C\Delta V/2\alpha I_j \doteq CV_a/2\alpha I_j.$$

Where Ij is a current injected from the emitter to the collector of the lateral PNP transistor 41, α is a common base current gain of the lateral transistor 41, and ΔV is a logic voltage swing near to the applied voltage Va. The injector current Ij is proportional to (Ni²/Nd) exp (qVa/mkT) where Ni and Nd are the carrier concentrations of an intrinsic semiconductor and the epitaxial layer (channel region 43), respectively, and m is a constant having a value between one and two. From the above two equations, the ratio of the delay time of SITL to that of IIL is $$\frac{\tau SITL}{\tau IIL} = \frac{C SITL \cdot V_a SITL}{C IIL \cdot V_a IIL} \cdot \frac{\alpha IIL}{\alpha SITL} \cdot \frac{Nd SITL}{Nd IIL} \cdot$$

$$\exp \frac{q(V_a IIL - V_a SITL)}{mkT}$$

Assuming αIIL=αSITL and the same value of m for SITL and IIL, when τSITL is equal to τIIL, $$1 = \frac{V_a SITL}{V_a IIL} \cdot \frac{1}{100} \exp \frac{q(V_a IIL - V_a SITL)}{mkT}$$

or VaSITL-VaIIL ≑ 0.1~0.2 volts can be estimated, because CSITL/CIIL=1/10 and NdSITL/NdIIL ≑ 1/10, as mentioned above. That is, the applied voltage Va for SITL is lower by 0.1~0.2 volts than that of IIL to obtain a particular delay time. This voltage difference is larger than 0.1~0.2 volts and increases with a decrease of Nd, the impurity concentration of the epitaxial layer (channel region 43), which also contributes to lowering the capacitance and increasing the value of $\alpha(\leqq 1)$.

In the case of I²L, for example see Tamama et al. (Tech. Digest of Electronics and Communication Society of Japan P.161 1976), Berger (IEEE J. Solid State Circuits, SC-9, P.218 (1974) and Hewlett (ibid SC-10, P.343 (1975)), the applied voltages can be estimated to be 0.625 volts at $\tau=60$ nsec., 0.758 volts at $\tau=80$ nsec and $\sim 1$ volt (described in the paper), in the respective papers. As mentioned later, each inverter which comprises T-type flip-flops to divide the 4 MHz signal should have a delay time less than $$\frac{1}{4 \times 10^6 \text{ (Hz)} \times 7 \text{ (stages)}} \div 36 \text{ nsec/inverter}$$

as a simple estimation. The applied voltage of I²L T-flip flops should be larger than 0.625~0.758 volts at 4 MHz.

Figure 7:
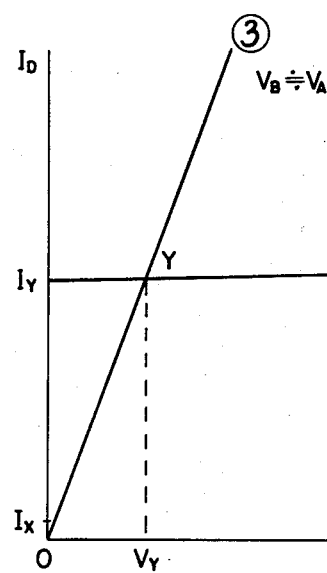
FIGS. 7a and 7b are respective schematic and experimental characteristic curves of voltage vs. current of a SITL inverter.
FIG. 7c is an experimental characteristic curve of the relation between delay time and SITL injector voltage.
Figure 7B:
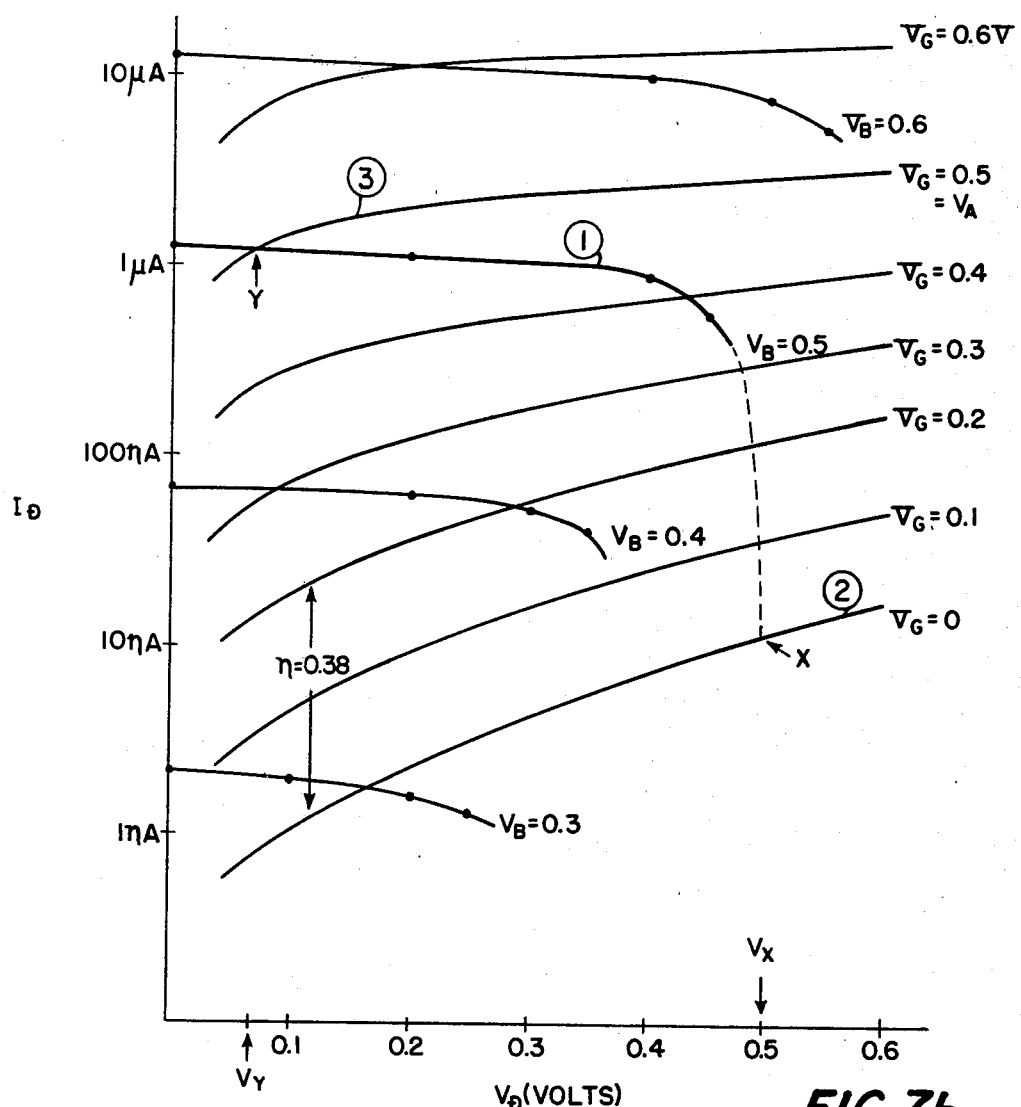
Figure 7C:
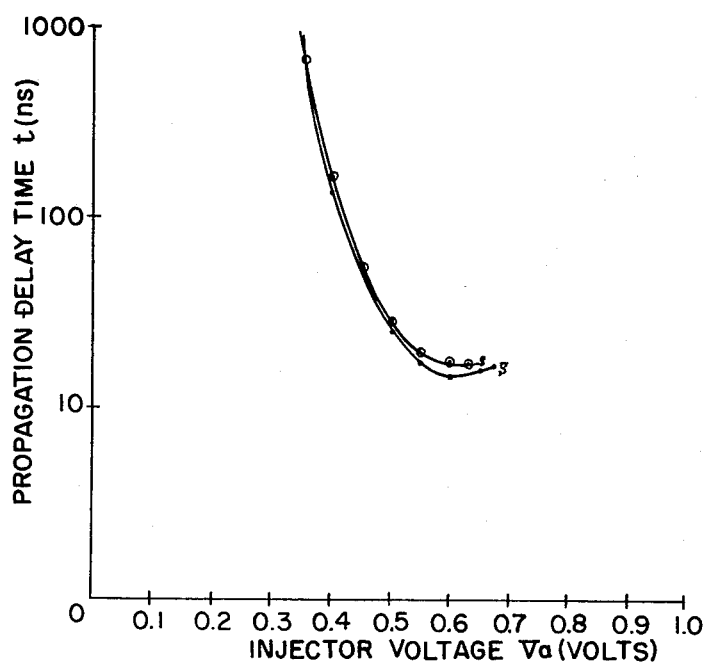

On the other hand, the SITL T-type flip-flop can divide 4 MHz at the applied voltage $(0.625\sim 0.758) - 0.1\sim 0.2$ volts $\div 0.5$ volts as shown in FIG. 7(c). This low applied voltage of about 0.5 volts creates many advantages such as low dynamic power dissipation even at 4 MHz operation, a small junction capacitance and others which will be described later, for watch and watch IC design. The high frequency operation at the lower voltage can be realized only by the SITL inverter, under the present design rule and technology, which comprises the channel (or epitaxial) region of lower impurity concentration less than $10^{14} \text{cm}^{-3}$ and a thickness nearly equal to the width of the depletion layer (to about 3 μm).

FIG. 7a is a schematic graph wherein the relationship between voltage and current for the inverter is shown, and FIG. 7b gives an example of an experimental result of that relationship. The curve ① represents a characteristic of the bipolar transistor 41, and the curves ② and ③ represent the characteristics of the SIT 42. Since the channel 43 acts as the depletion layer when the input voltage $V_B$ of the inverter is 0 volts, in order to flow the drain current $I_D$, it is necessary to sufficiently increase the drain voltage $V_C$ of the SIT. In practice, the SITL is operated in the region wherein the drain current $I_D$ is small when the SIT 42 is turned off. Since almost the entire portion of the depletion layer in the channel 43 of the SIT 42 ceases to exist when the input voltage $V_B$ of the inverter approximately equals the applied voltage $V_A$, the channel 43 acts as a fixed resistance element having a constant value which depends on the size and the relative resistance of the channel 43, and then the value of the current flowing through the channel will be proportional to the value of the voltage $V_C$ of the drain 39.

When the PNP transistor 41 is connected to the SIT 42 which operates as described above and a load, the output voltage of the inverter can be changed in accordance with changes of the input signal of the inverter.

Figure 8:
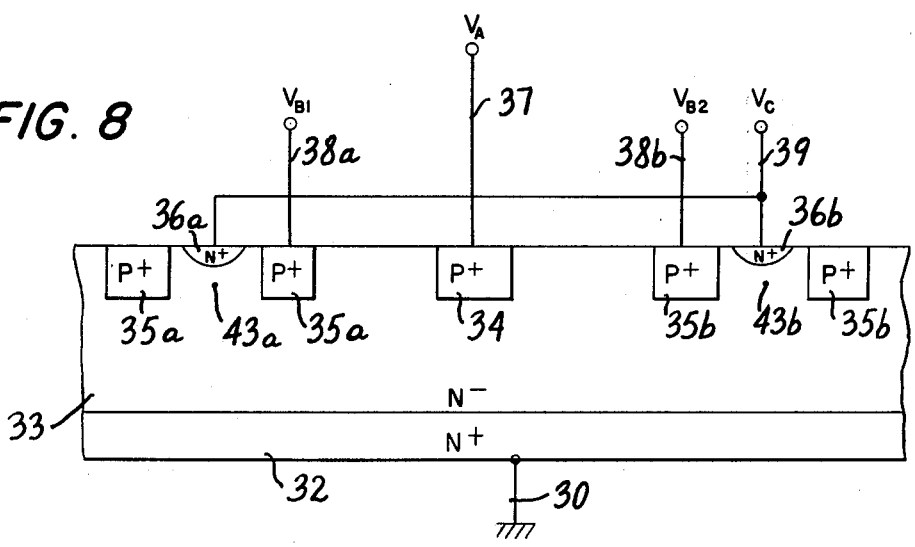
FIG. 8 shows a cross-sectional view of a SITL NAND gate.

FIG. 8 shows a cross-sectional view of an SITL NAND gate, FIG. 9 shows a plane view of the NAND gate shown in FIG. 8, FIG. 10 shows an equivalent circuit diagram of the NAND gate shown in FIG. 8, and FIG. 11 illustrates a circuit diagram symbol for the NAND gate shown in FIG. 8.

From the above explanation, it is obvious that the SITL is the IC circuit structure which can be operated at the highest frequency with less dynamic power and lower applied voltage than any other type IC which has been discussed. In addition, an open-drain type inverter or a NAND gate can be easily fabricated by using the SITL.

FIG. 12 shows an example of a SITL crystal oscillating circuit for a watch. The principle of operation of the circuit shown in FIG. 12 is the same as that of a circuit constructed by using CMOS. In FIG. 13, a detailed circuit diagram of the oscillating circuit is shown. In FIG. 13, the oscillating circuit comprises a main inverter 42a, a quartz vibrator 55 used as a component of the resonator, a resonance capacitor 54, a resistor 53 and a SIT 42c. The resistor 53 and the SIT 42c are used to apply a bias voltage to the inverter 50. Furthermore, the oscillating circuit has an inverter 42b used as an output buffer circuit. Since the operation of the circuit elements is clear from the foregoing explanation describing the operation of the SIT, a detailed explanation of the operation of the oscillator circuit elements is omitted here.

It is effective for high efficiency and low power dissipation to use an SIT in an oscillating circuit because of the high speed of SITL.

Figure 16:
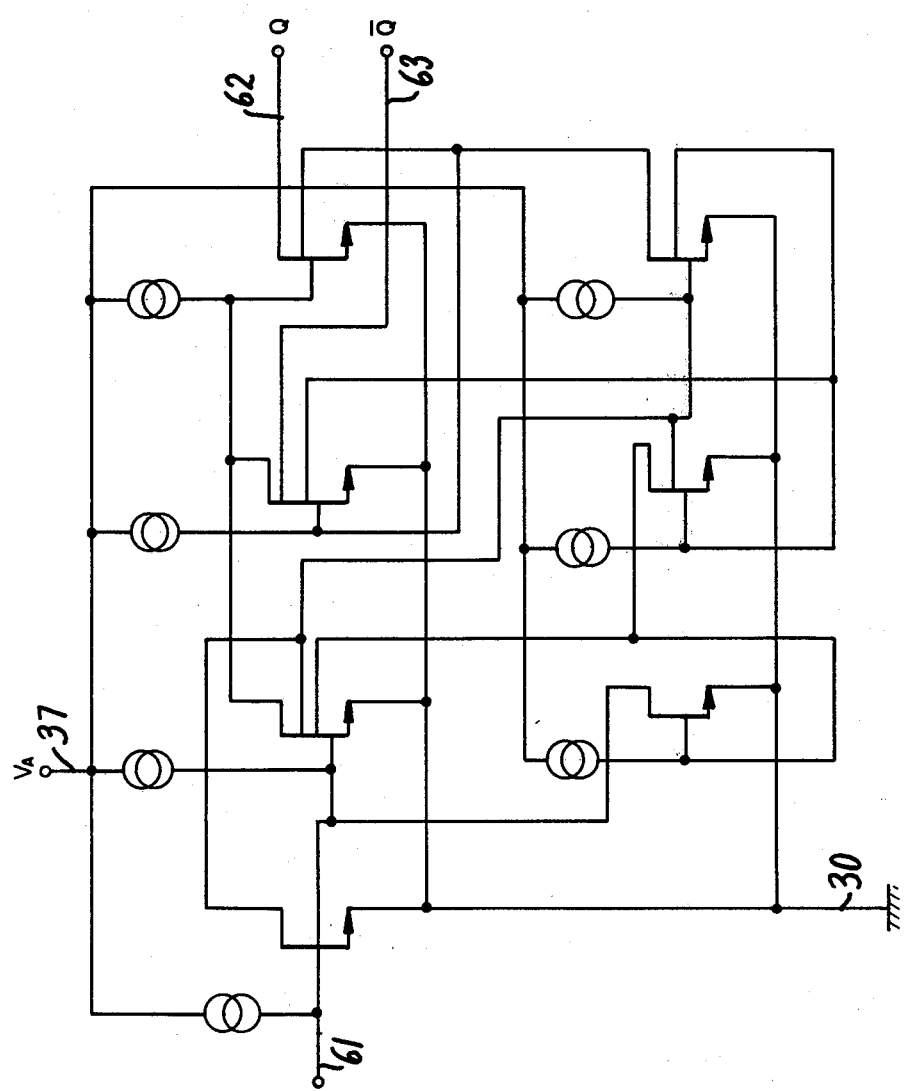
FIG. 16 shows an equivalent circuit diagram of the T-type flip-flop shown in FIG. 15.

FIG. 14 shows a frequency dividing circuit which is widely used as a frequency dividing circuit for a watch and is comprised of twenty-two cascaded T-type flip-flops, FIG. 15 is a logic circuit diagram of one of the T-type flip-flops shown in FIG. 14, and FIG. 16 shows an equivalent circuit diagram wherein the T-type flip-flop shown in FIG. 15 is realized by using SITL. A further detailed explanation of the operation of this circuit is also omitted.

FIG. 17 is a six advance counting circuit which is widely used as a counting circuit for a watch. This counting circuit consists of a T-type flip-flop pair of the type shown in FIG. 15 and a D-type flip-flop.

FIG. 18 shows a logic diagram of the D-type flip-flop shown in FIG. 17, FIG. 19 shows an equivalent circuit of the D-type flip-flop shown in FIG. 17 wherein the D-type flip-flop is realized by using SITL.

TABLE 3

| COUNT | DIS-PLAY | DECODER IN | | | DECODER OUTPUT | | | | | | |
|---|---|---|---|---|---|---|---|---|---|---|---|
| | | $Q_A$ | $Q_B$ | $Q_C$ | a | b | c | d | e | f | g |
| 0 | 0 | 0 | 0 | 0 | 1 | 1 | 1 | 1 | 1 | 1 | 0 |
| 1 | 1 | 1 | 0 | 0 | 0 | 1 | 1 | 0 | 0 | 0 | 0 |
| 2 | 2 | 0 | 1 | 0 | 1 | 1 | 0 | 1 | 1 | 0 | 1 |
| 3 | 3 | 0 | 0 | 1 | 1 | 1 | 1 | 1 | 0 | 0 | 1 |
| 4 | 4 | 1 | 0 | 1 | 0 | 1 | 1 | 0 | 0 | 1 | 1 |
| 5 | 5 | 0 | 1 | 1 | 1 | 0 | 1 | 1 | 0 | 1 | 1 |

Table 3 is a truth table for a part of the signal converting circuit or decoder, which converts the binary signal from the six advance counting circuit shown in FIG. 17 into the time signal and supplies the time signal to the driving circuit 10 for driving the display device 2.

Figure 20:
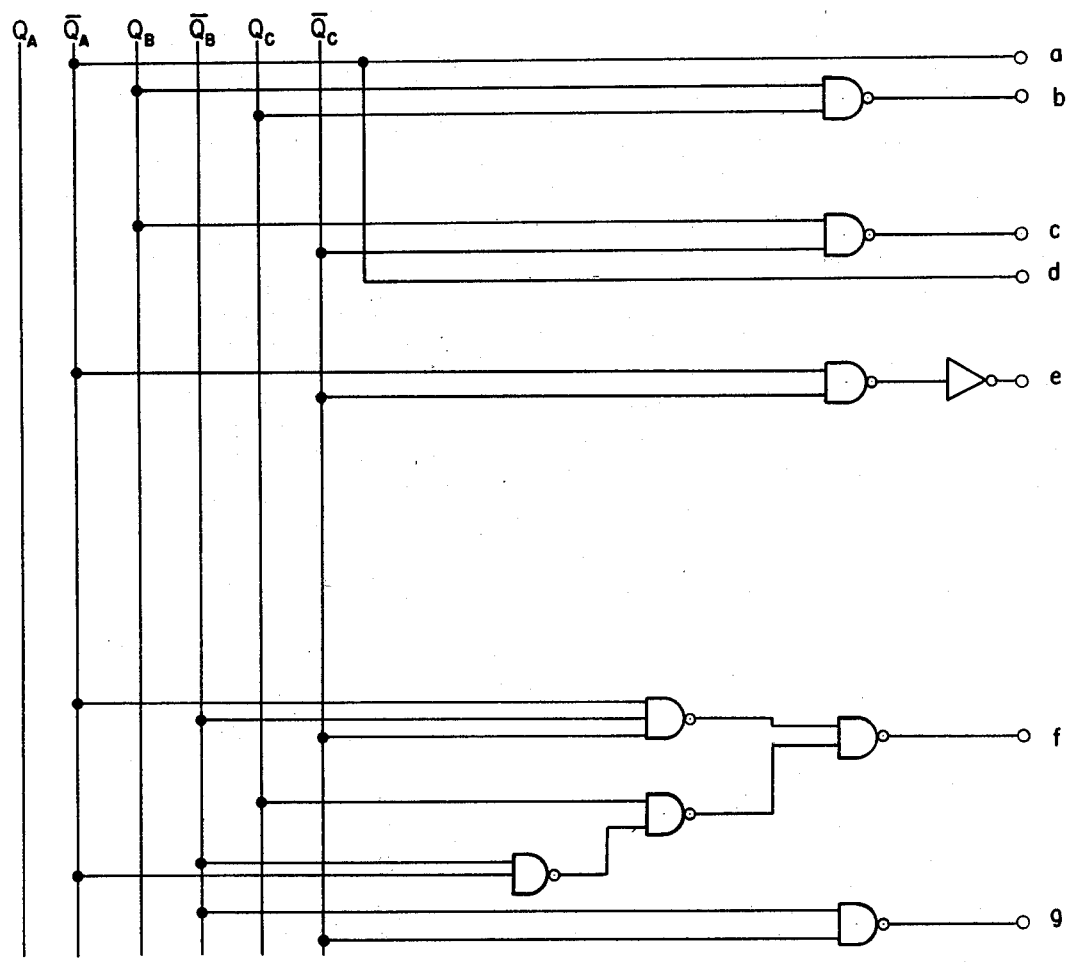
FIG. 20 is a logic diagram for a signal converting circuit.

FIG. 20 is logic diagram for the signal converting circuit which can be represented by using the truth table of Table 3.

Figure 21:
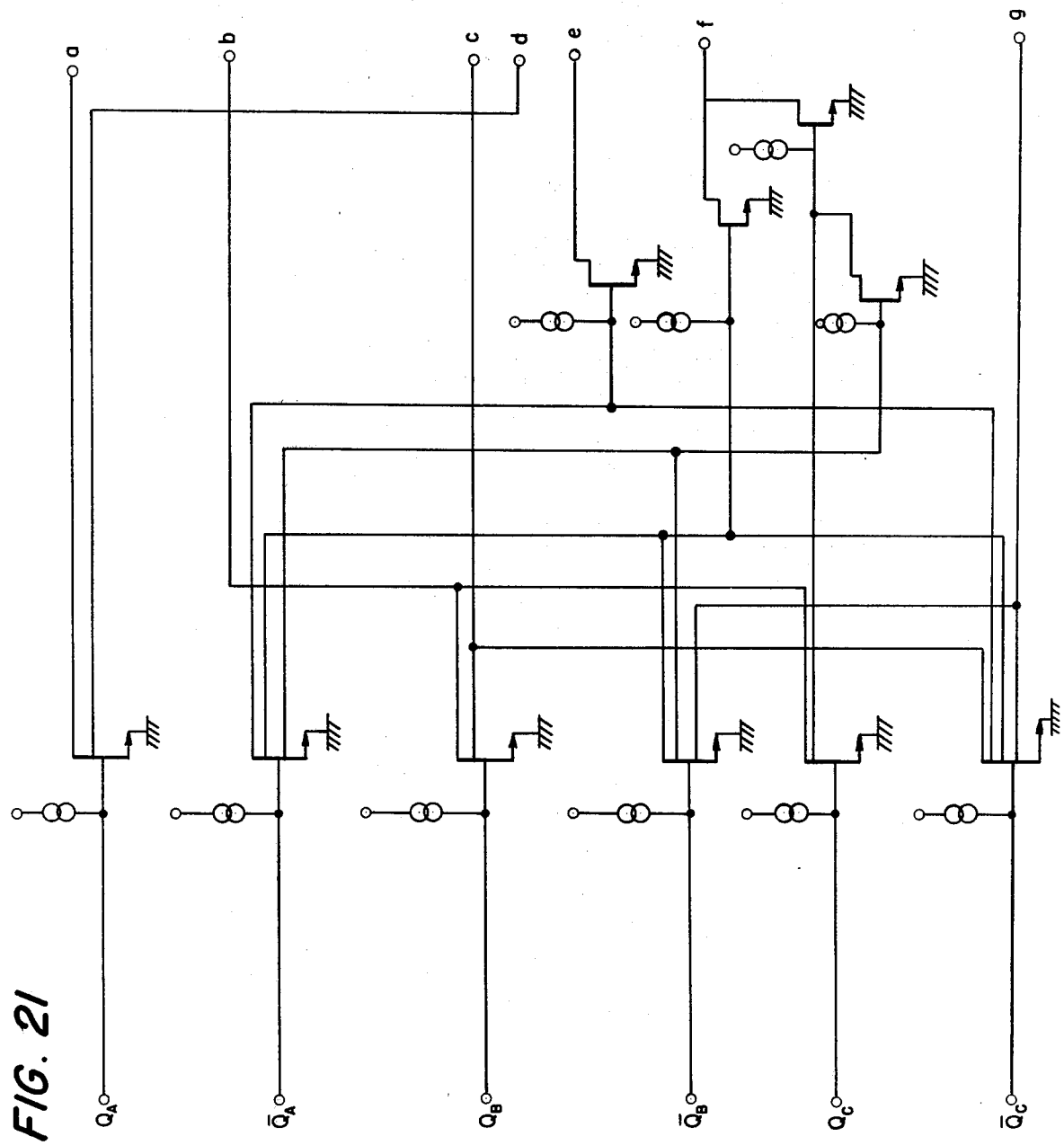
FIG. 21 is an equivalent circuit of the signal converting circuit shown in FIG. 20 realized by using SITL.

FIG. 21 shows an equivalent circuit of the signal converting circuit shown in FIG. 20 in the case that the signal converting circuit is realized by using SITL.

Since the operation of these circuits using SITL is also understood from the above discussion, a detailed explanation thereof is omitted.

FIG. 22(a) is a block diagram wherein the connection between the IC and the display device 2 is shown.

In FIG. 22(a), signal converting circuit or decoder 9 includes a final stage logic circuit 80 and an interface circuit 81 for connecting between the driving circuit 10 and logic circuit 80.

Although, in general, applying a voltage preferably less than 0.5 volts to the SITL is the effective way to obtain the best operating condition, the display device 2, such as the light emitting diode or liquid crystal display device, employs a voltage of about 3 volts. Therefore, the interface circuit 81 is required for changing the level of the voltage between the final logic stage 80 and the driver 10.

FIG. 22(b) is an equivalent circuit of the circuit shown in FIG. 22(a) for the case that the circuit shown in FIG. 22(a) is realized by using SITL.

A SIT 82a acts as a part of the final logic stage in the signal converting circuit, the the interface circuit 81 is an example of a circuit made by using a SIT 82b. In the interface circuit 81, the current capacity of a current source used as the load of the SIT 82b must be determined in such a way as to correspond to the current capacity of a digit driver 82c in a driving circuit 10a. A driving circuit 10b is used as a segment driver, and in this embodiment a lateral bipolar transistor 83a is used. Use of SIT or bipolar transistor structure is effective to reduce the IC chip size because of their high driving ability in spite of small device area.

The mode of operation of this structure will also be understood from the foregoing, however, a brief explanation will be made about the circuit operation.

When the transistor of the final logic circuit stage in the converting circuit 9 is turned off (that is, the logic value of the output is "1"), the SIT 82b of the interface circuit 81 will be turned on (that is, the logic value of the output will become "0"). In turn, the SIT 82c of the digit driver 10a becomes off ("1"), and a sufficiently large value of positive bias is applied to the gate of the SIT 82d, as a result of which the SIT 82d is turned on. Thus, the digit driver 10a will be turned on.

On the other hand, to the segment driver 10b corresponding to that digit in the light emitting diode display device 2a that is driven by digit driver 10a, the signal having a logic value of "0" is applied from the interface circuit the same as the interface circuit 81 of the digit driver 10a, as a result of which the transistor 83a is turned on. Therefore, in the case of the circuit shown in FIG. 22b, when the outputs 86a and 86b of the interface circuit 81 become "0", the segment f in the light emitting diode display device 2a is lighted. When the input 86b of the segment driver 10b becomes "1", the segment f in the light emitting diode display device 2a is not lighted. In addition, the resistor 89a shown in FIG. 22b can be replaced by a bipolar transistor for high packing density.

FIG. 23 is a block diagram of a driving circuit for use with a liquid crystal display device. Basically, the display device using a liquid crystal is the same as the display device using light emitting diodes, however, the liquid crystal display device is different from the light emitting diode display device in that the final drivers of the driving circuit 10 are complementary circuits and are connected in series, and the final logic circuit 80b in the signal converting circuit 9 is an exclusive OR gate.

FIGS. 24a and 24b show a circuit diagram symbol and a logic diagram of an exclusive OR gate; Table 4 is a truth table of an exclusive OR gate

TABLE 4

| A | B | C |
|---|---|---|
| 0 | 0 | 0 |

TABLE 4-continued

Figure 25:
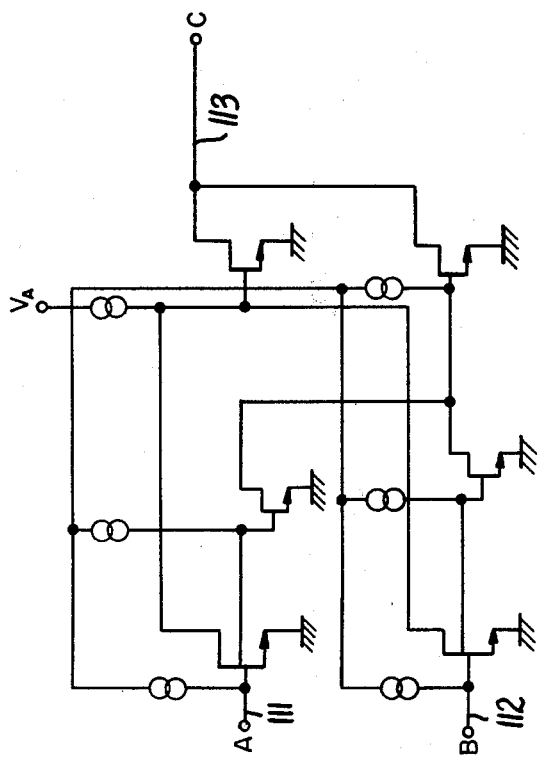
FIG. 25 shows an equivalent circuit for an exclusive OR gate realized by using a SITL.

| A | B | C |
|---|---|---|
| 1 | 0 | 1 |
| 0 | 1 | 1 |
| 1 | 1 | 0 | and, FIG. 25 shows an equivalent circuit of an exclusive OR gate realized by using SITL. A detailed explanation of the operation in this circuit is omitted.

Figure 26:
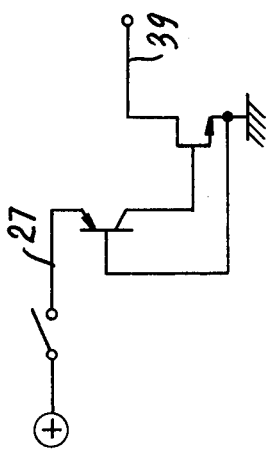
FIG. 26 shows a switching circuit.

FIG. 26 is a switching circuit which is required for adjusting the time in an electronic timepiece.

A switching signal can be easily obtained by directly connecting the emitter 37 of the PNP transistor of the basic inverter comprised of SITL to mechanical switches 3a and 3b.

A manufacturing process for the SITL, as seen from FIG. 3, is the same as for conventional ICs. In the case of fabrication of CMOS, at least seven masks are required. In the manufacture of SITL as well as IIL, at least five masks are required for fabrication. Therefore, the manufacturing process of SITL is the same as that of IIL in that the manufacturing process of SITL is easier than that of the CMOS. However, the dynamic power of the SITL is lower than that of the IIL by at least one order of magnitude. As seen from the construction of SITL, the density of a circuit using SITL is equal to that of IIL.

Today, CMOS-SOS is well known as the type of IC which can be operated at high frequency with less power consumption. However, CMOS-SOS has disadvantages in that it is difficult to decrease a leakage current (static power) if there is a fault at the junction portion between the substrate and the silicon layer thereon, manufactured by means of a crystal growth method. The manufacturing process of the CMOS-SOS is different from a conventional IC, and is more complex than a competing conventional IC, and CMOS-SOS is expensive to manufacture. However, if the SITL is fabricated by using an insulating substrate, such as SOS, it is possible to reduce the dynamic power even further, which is about 1/10 that of usual CMOS.

In addition, SITL may be used together with another IC structure either when the SITL is fabricated on the chip of another IC or on another independent chip. For example, lower power operation can be achieved if CMOS, which can be operated with less static power, is used within a low frequency region and SITL, which can be operated with less dynamic, is used within a high frequency region.

Figure 28:
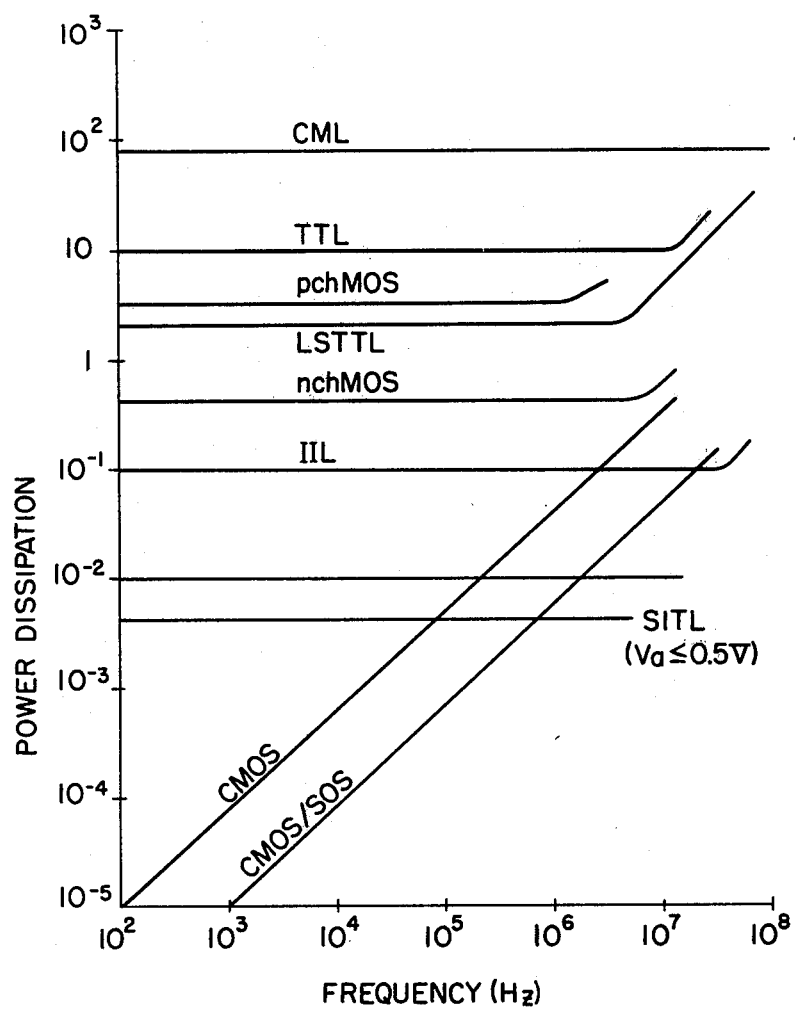
FIG. 28 shows the frequency vs. power dissipation characteristics of various logic inverters.

In FIG. 28, the relation between the dissipated power and the frequency of various logic IC are shown. This data is taken in part from Verhotstadt (Proc. IEEE, 46, 6, p.842 (1976)). In this figure, the characteristic curve of the SITL is drawn in with the assumption that the dynamic power ratio of SITL to that of IIL is as described in Table 1. The order of power dissipation shown in FIG. 28 is different from that in Table 1, which is caused by a difference of design rule and a simple estimation by which the data in Table 1 was arrived at. FIG. 28 shows that the power dissipaton of CMOS decreases with a decrease of operating frequency, and that the power dissipation of IIL and SITL are nearly constant even at low frequency, which may occur due to the significant static power dissipated in the IIL and the SITL at a constant applied voltage. From FIG. 28, it can be seen that if SITL is operated above 100~500 kHz and CMOS is operated below 100~500 kHz, further reduction of power dissipation will occur. The critical frequency for chosing between the different IC structure is variable and is selected according to the design rule of CMOS and SITL.

Figure 27A:
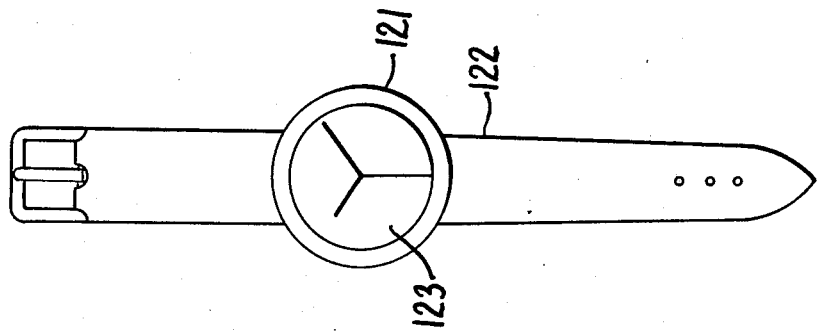
FIG. 27(a) shows an external view of an embodiment of the electronic watch according to the present invention.
Figure 27B:
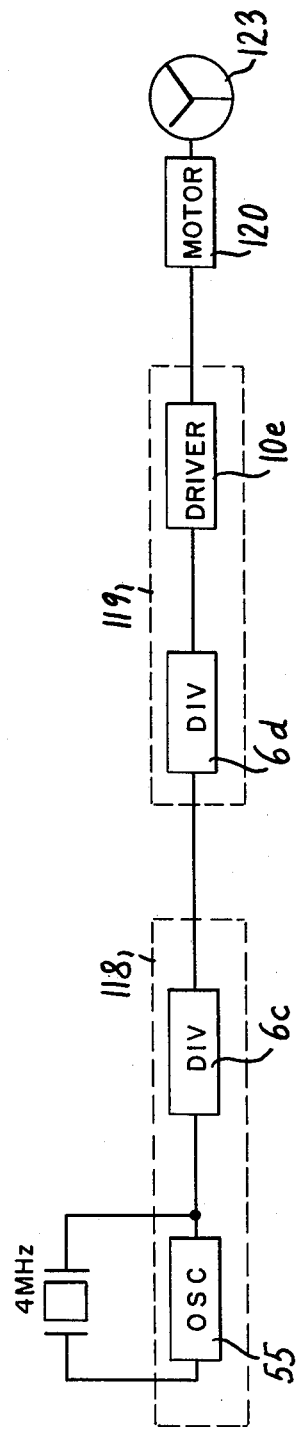
FIG. 27(b) shows a block diagram of the embodiment of the present invention.
Figure 27C:
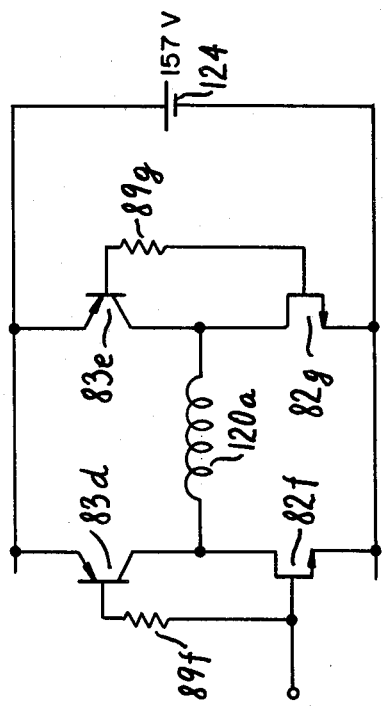
FIG. 27(c) shows a circuit diagram of a driving circuit shown in FIG. 27(b)

FIG. 27(b) shows an example of an analog display type watch wherein two types of IC structure are employed. That is, the 4 MHz quartz vibrator 55 is driven by using a SITL-IC 118, and a signal of 32 kHz, for example, is developed by frequency division in the SITL-IC 118. The signal of 32 kHz. from the SITL-IC 118 is applied to a CMOS-IC 119, and an output signal of the CMOS-IC 119 drives a motor 120, and the hands of the movement 123 of the watch are rotated. In FIG. 27(a), 121 is a casing of the watch, and 122 is a watch-band.

In FIG. 27(b), 6c is a frequency dividing circuit using SITL, 6d is a frequency dividing circuit using MOS, and 10e is a driver using MOS. In addition, if the driver 10e is comprised of SITL or bipolar transistors instead of MOS, the area of the IC can be reduced. This is a great advantage.

Also, the driving circuit of the electronic timepiece using SITL can be operated with less dynamic power in comparison with the driving circuit using CMOS or IIL. Moreover, in the case of CMOS, the static power can be reduced, however, the IC using CMOS has the disadvantage of low packing density and low output power.

A driving circuit using SITL is suitable for driving a motor or light emitting diode, because SITL has less output resistance in comparison with a bipolar type driving circuit. High power can be derived from a bipolar driving circuit only by enlargement of the device area.

The above-described advantages of SITL have certain advantageous consequences when SITL is incorporated in the integrated circuit of an electronic timepiece. The lower applied voltage required for SITL, which is less than 0.7 volts, and which advantageously may be about 0.5 volts, enables the reduction of current consumption in a stacked-circuit structure like that disclosed in the Williams U.S. Pat. No. 3,986,199. The low dissipated power of the SITL avoids the integrated circuit developing a temperature distribution with large temperature gradients. This contributes to the accuracy of the timepiece. The high-packing density of SITL reduces the integrated circuit chip size, or allows the incorporation of additional functions into the timepiece. Moreover, SITL is easily fabricated, and this increases the yield of usable integrated circuits and reduces the cost of the integrated circuit.

The practical consequences of the lower applied voltage of SITL are profound. The lower applied voltage of SITL enables circuit structure having two or three stacks to be realized, and which includes a four MHz divider, when a battery having a voltage of about 1.5 volts (AgO or HgO) is used, and even when a current regulator circuit is constructed in the stacked circuit. In the case of IIL, the applied voltage to a four MHz divider should be higher than 0.7 volts which means that it is impossible to realize the stacked-circuit structure in a timepiece with a four MHz divider and which uses a 1.5 volt battery. Instead, a three volt battery, such as Li, with a high internal resistance is required, and this necessitates a larger area and limits the design of the timepiece circuit, the watch, clock and so on. Furthermore, a small 3 volt battery (Li) cannot drive a step-motor of a watch because of high internal resistance.

What is claimed is:

1. In an electronic timepiece including a semiconductor integrated timepiece circuit, the improvement comprising: said timepiece circuit having a stacked logic level circuit structure comprising static induction transistor logic, said stacked logic level circuit structure including at least two static induction transistor inverter circuits which each operate at less than 0.5 volts and which are connected in series; and an electric power cell having a nominal voltage of 1.5 volts connected for applying the nominal 1.5 volts to power said timepiece circuit.

2. In an electronic timepiece according to claim 2, said timepiece circuit including in at least one logic level a multistage divider circuit comprised of a plurality of divider stages connected in a countdown chain, at least a first divider stage of said divider circuit comprising a static induction transistor inverter circuit; and means for powering said static induction transistor inverter circuit at less than 0.5 volts.

3. In an electronic timepiece according to claim 1 or 2, wherein said electric power cell is a battery comprising compounds selected from the group consisting of AgO and HgO.

4. In an electronic timepiece according to claim 1 or 2, wherein said timepiece circuit includes a time base signal source for generating a time base signal having a frequency greater than about one megahertz; said divider circuit receives the time base signal for dividing the time base signal and for developing a low frequency timing signal representative of time.

5. An electronic timepiece, comprising:
a time base signal source for developing a repetitive high frequency time base signal, said time base signal source comprising a quartz vibrator having a frequency of about one megahertz or higher and an inverter circuit, and said inverter circuit comprising a static induction transistor comprised of a source region, a gate region and a drain region, and a bipolar transistor comprised of a collector region common to said gate region, a base region common to said source region and an emitter region;
an integrated multi-stage divider circuit comprised of a plurality of divider stages connected in a countdown chain for dividing the high frequency time base signal and for developing a low frequency timing signal representative of time, wherein at least the first divider stage of said divider circuit includes an inverter circuit comprised of a static induction transistor including a source region, a gate region and drain region, and a bipolar transistor having a collector region which is common to said gate region, a base region which is common to said source region and an emitter region, said inverter circuit of the first divider stage having circuit parameters for rendering said inverter circuit operative at a voltage less than 0.5 volts;
another circuit stage of the electronic timepiece having circuit structure operative at a voltage less than 0.5 volts;
means for connecting said inverter circuit of said divider circuit in series with said another circuit stage of said timepiece; and
display means receptive of the low frequency timing signal for displaying time.

6. An electronic timepiece according to claim 5, wherein said multi-stage divider circuit further includes divider stages which operate at frequencies less than one megahertz and which are comprised of CMOS transistor inverter circuits.

7. An electronic timepiece according to claim 5, wherein divider stages of said multi-stage divider circuit operating above a critical frequency are comrpised of static induction transistor inverter circuits and divider stages operating at the critical frequency and less than the critical frequency are comprised of CMOS transistor inverter circuits.

8. An electronic timepiece according to claim 7, wherein the critical frequency is 1 MHz.

9. An electronic timepiece according to claim 5, further comprising a battery having a voltage of about 1.5 volts for powering said timepiece with a total voltage of about 1.5 volts.

10. In an electronic timepiece including a semiconductor integrated timepiece circuit, the improvement comprising:
an electronic power cell having a nominal voltage of 1.5 volts for powering said timepiece circuit; and
said timepiece circuit having a stacked logic level circuit structure comprising static induction transistor logic, a time base signal source for generating a time base signal having a frequency greater than about four megahertz, at least one logic level including a multi-stage divider circuit comprised of a plurality of divider stages connected in a countdown chain and having a first and successive divider stages which operate at a frequency greater than about one megahertz and which comprise static induction transistor inverter circuits, said multi-stage divider circuit receiving the time base signal for dividing same and for developing a low frequency timing signal representative of time, and means receptive of the nominal 1.5 volt power cell voltage for powering respective ones of said logic levels with a voltage of less than 0.5 volts.

11. In an electronic timepiece according to claim 10, wherein said multi-stage divider circuit includes divider stages which operate at a frequency less than about one megahertz and which are comprised of CMOS transistor inverter circuits.

12. In an electronic timepiece according to claim 11, wherein the number of divider stages comprised of static induction transistor inverter circuits and the number of divider stages comprised of CMOS transistor inverter circuits are selected to optimize the power cell lifetime.

13. An electronic timepiece according to claim 9, wherein said battery is an electric power cell comprising compounds selected from the group consisting of AgO and HgO.

14. An electronic timepiece, comprising:
a quartz vibrator time base signal source having a quartz vibrator element and a frequency of about one megahertz or higher, and an inverter circuit consisting of a static induction transistor formed by a source region, a gate region, and a drain region and a bipolar transistor formed by a collector region common to said gate region, a base region common to said source region, and an emitter region;
an integrated multi-stage divider circuit composed of a plurality of divider stages connected in a countdown chain for dividing the time base signal to generate a low frequency timing signal representative of time, wherein at least the first divider stage of said divider circuit consists of an inverter circuit having the same structure as said inverter circuit in said vibrator;
a voltage supply for supplying voltage to the timepiece;
another circuit stage of the timepiece; wherein at least said first divider stage and said another circuit stage having said inverter circuit structure are connected in series to the voltage supply and operate under a voltage less than 0.5 volt for each of said first divider circuit and said another circuit stage; and
display means receptive of the low frequency timing signal for displaying time.

15. An electronic timepiece according to claim 14, wherein divider stages of said multi-stage divider circuit operating above a critical frequency are comprised of said inverter circuit, and divider stages operating at less than the critical frequency are comprised of CMOS circuits.

16. An electronic timepiece according to claim 15, wherein said critical frequency is 1 MHz.

17. An electronic timepiece according to claim 4, further comprising a battery having a voltage of about 1.5 volts for powering said timepiece with a total voltage of about 1.5 volts.

18. An electronic timepiece according to claim 17, wherein said battery is an electronic power cell made of compounds selected from the group consisting of AgO and HgO.

* * * * *